US006468849B1

(12) United States Patent
Efland et al.

(10) Patent No.: US 6,468,849 B1
(45) Date of Patent: Oct. 22, 2002

(54) METHODS AND DEVICES FOR OPTIMIZED DIGITAL AND ANALOG CMOS TRANSISTOR PERFORMANCE IN DEEP SUBMICRON TECHNOLOGY

(75) Inventors: Taylor R. Efland, Richardson; Alec J. Morton; Chin-Yu Tsai, both of Plano, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/589,957

(22) Filed: Jun. 8, 2000

Related U.S. Application Data
(60) Provisional application No. 60/138,727, filed on Jun. 11, 1999.

(51) Int. Cl.[7] .......................................... H01L 21/8238
(52) U.S. Cl. ...................................... 438/200; 438/217
(58) Field of Search ............................ 438/163, 200, 438/217, 286, 289, 291, 301, 304, 305, 306, 181, 199, 275

(56) References Cited

U.S. PATENT DOCUMENTS

| | | | | |
|---|---|---|---|---|
| 5,923,987 A | * | 7/1999 | Burr | 438/304 |
| 5,953,599 A | * | 9/1999 | El-Diwany | 438/199 |
| 6,172,401 B1 | * | 1/2001 | Brand | 257/344 |

OTHER PUBLICATIONS

Taur et al., "CMOS Devices below 0.1$\mu$m: How High Will Performance Go?" IBM Research, Yorktown Heights, NY and Microelectonics Division, Essex Junction, VT 0–7803–4103–1 (c) 1997 IEEE.

Gwoziecki et al., "Smart pockets—total suppression of roll–off and roll up," France Telecom, CNET Grenoble, BP 98, 38243 Meylan Cedex, France, 4–930813–94–8/99.

Cao et al., "Modeling of Pocket Implanted MOSFETs for Anomalous Analog Behavior," Department of Electrical Engineering and Computer Sciences, University of California, Berkeley, CA 94720, USA, Spice Modeling Lab., Texas Instruments, Dallas, Texas 75266, U.S.A., 0–7803–5413–3/99, 1999 IEEE.

* cited by examiner

*Primary Examiner*—Hoai Ho
*Assistant Examiner*—Phuc T. Dang
(74) *Attorney, Agent, or Firm*—Jacqueline J. Garner; W. James Brady, III; Frederick J. Telecky, Jr.

(57) ABSTRACT

High performance digital transistors (140) and analog transistors (144, 146) are formed at the same time. The digital transistors (140) include first pocket regions (134) for optimum performance. These pocket regions (134) are masked from at least the drain side of the analog transistors (144, 146) to provide a flat channel doping profile on the drain side. Second pocket regions (200) may be formed in the analog transistors. The flat channel doping profile provides high early voltage and higher gain.

7 Claims, 8 Drawing Sheets

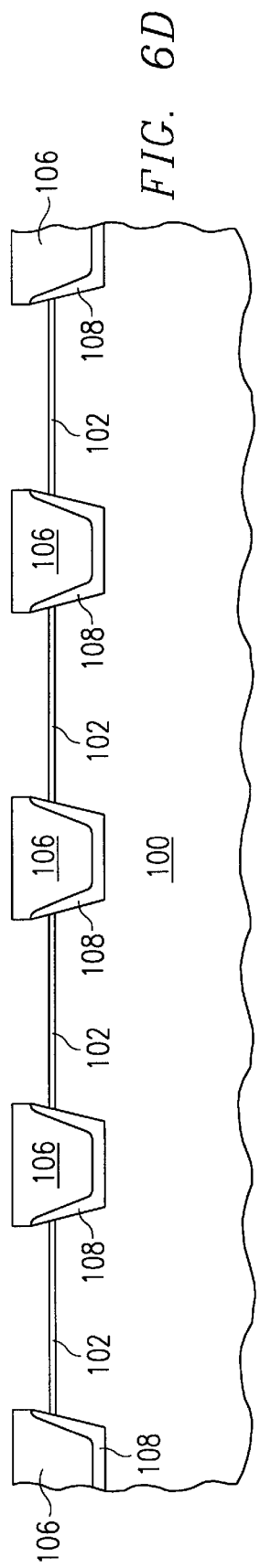
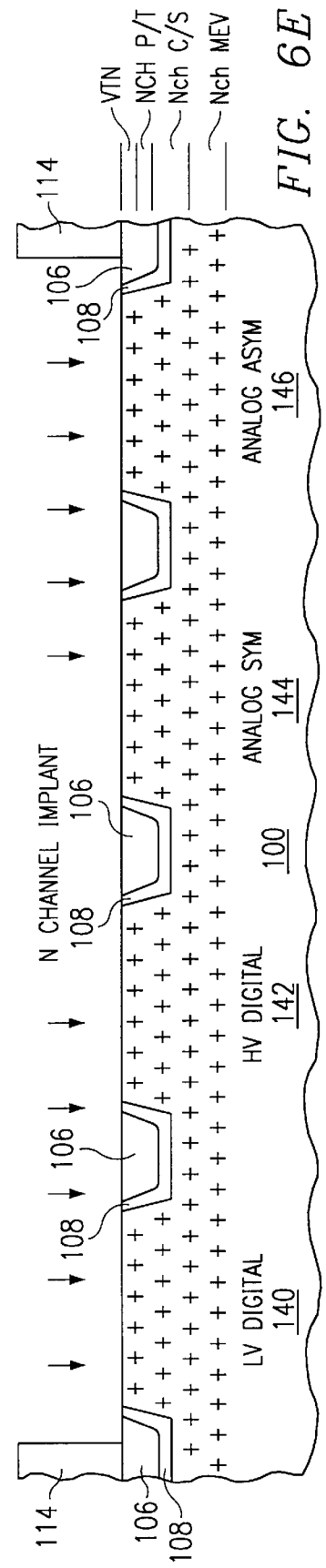

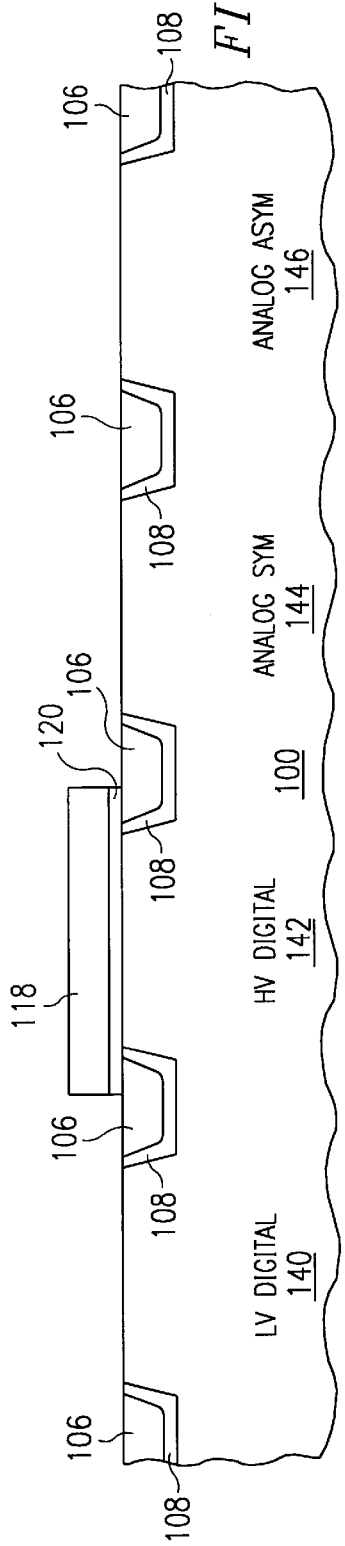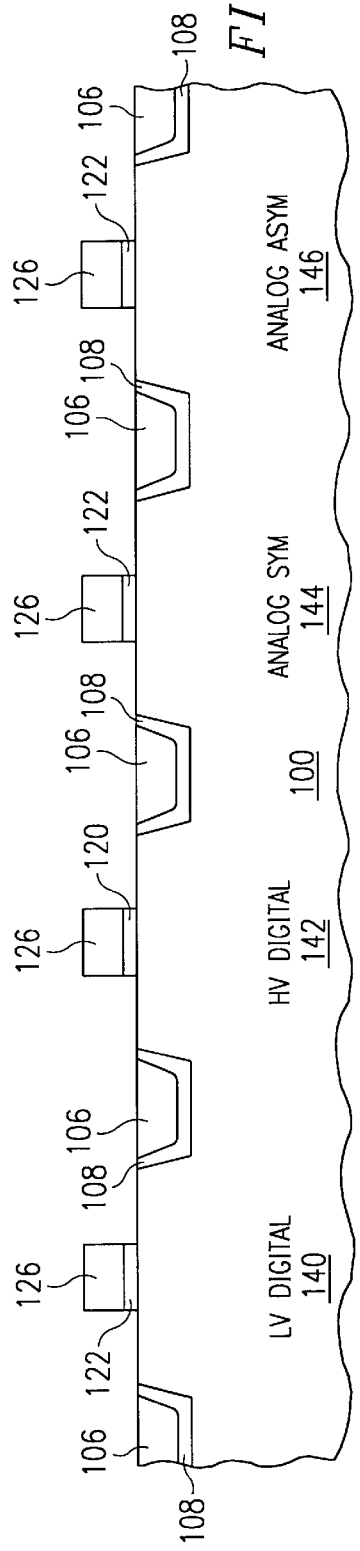

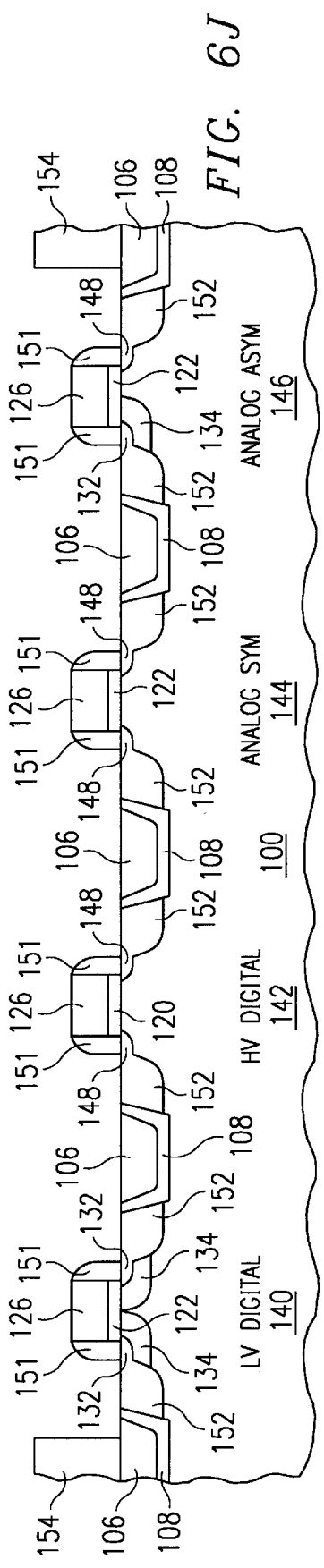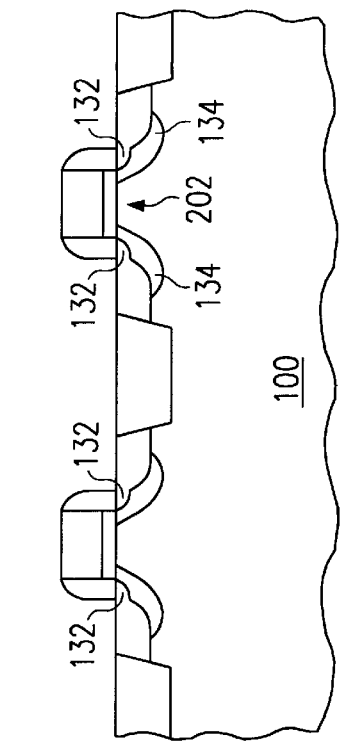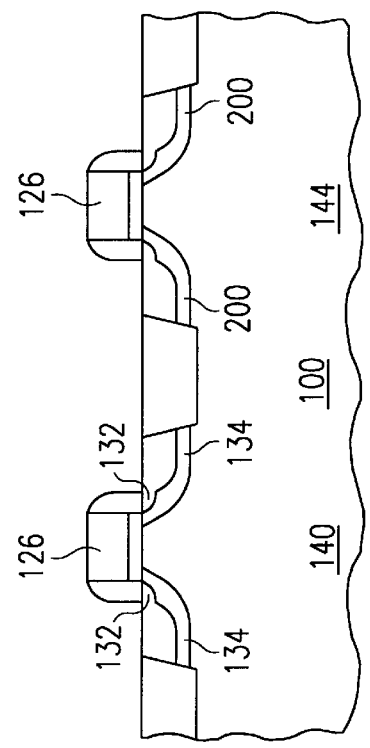

METHODS AND DEVICES FOR OPTIMIZED DIGITAL AND ANALOG CMOS TRANSISTOR PERFORMANCE IN DEEP SUBMICRON TECHNOLOGY

CROSS-REFERENCE TO RELATED APPLICATIONS

This application claims priority under 35 USC §119(e)(1) of provisional application No. 60/138,727 filed Jun. 11, 1999.

The following co-pending application is related and hereby incorporated by reference:

| Serial No. | Filing Date | Inventors |
|---|---|---|
| 60/138728 | 06/11/99 | Chatterjee et al. |

FIELD OF THE INVENTION

The invention is generally related to the field of semiconductor devices and more specifically to fabricating semiconductor devices having both analog and digital transistors.

BACKGROUND OF THE INVENTION

As digital CMOS technology extended into the deep submicron range (e.g., 0.35 µm and below), a device feature was developed to enable a much shorter channel length. This particular feature is a pocket implant. As shown in FIG. 1, pocket implants are used to provide a pocket region 16 of heavier doping of the same conductivity type as the channel/body 18 of the CMOS transistor 20. Pocket regions 16 extend further under the gate than drain extension regions 24. The drain 12 and source 14 regions are of opposite conductivity type with respect to the channel/body 18.

The pocket implant energy and anneal temperatures and times are designed such that the final dopant distribution serves to increase the channel doping concentration. The increased channel doping concentration reduces the depletion regions arising due to the electrostatic potential differences between source and the substrate and, more importantly, between the drain and the substrate. Such reduction in the depletion regions is known to result in improved short-channel characteristics, in particular, it leads to a reduced drain-induced barrier lowering or DIBL effect. Reduction in DIBL is critical to the ability to scale the MOSFET to smaller channel lengths without a concurrently sharp increase in subthreshold leakage. The key feature that has led to the use of pocket implants to increase the channel doping concentration in preference to the more conventional threshold voltage adjust implants is the fact that pocket implants are self-aligned to the gate. This means that the implant is largely blocked by the gate material so that the increased channel doping density due to the implant occurs only in the vicinity of the source and drain regions. One consequence of this is that the average doping density in the channel is low at long channel lengths and increases as the channel length is reduced. This is a desirable feature because the higher doping helps suppress the undesirable DIBL effect which is worse at smaller channel lengths, while at the longer lengths where such a high doping density is not needed the lower doping density results in higher inversion charge when the transistor gate is biased to turn on and conduct current. Higher inversion charge leads to a correspondingly higher drive current. Thus, over a statistical distribution of channel lengths one is able to obtain a higher drive current while maintaining a low off current.

High drive current increases the switching speed of digital logic gates, especially when the gates are required to drive large loads such as a long metal line. Low off current leads to a low standby power for CMOS logic circuits. Thus, MOSFETs designed with pocket implants are very attractive for high performance CMOS digital logic circuits. However, that is not true for many of the CMOS analog circuits. For example, the dc voltage gain of a CMOS differential amplifier is high for high values of gm/gds, where gm is the MOSFET's small signal transconductance and gds is the MOSFET's small-signal output conductance. Also, the standby power depends on the dc bias current, where the bias current value is designed for high gm/gds.

Unfortunately, it turns out that the high doping density localized near the drain region of MOSFETs, so typical of transistors with pocket implants, also makes it difficult to achieve a low gds. The self-aligned pocket implants naturally lead to a laterally nonuniform channel doping profile with the doping density low at the center and increasing to a pocket of high doping near the drain, as shown in FIG. 2. Such a profile causes an increasing potential barrier for the charge carriers (electrons for nMOS and holes for pMOS) to flow from the center to the drain. Being coincident with the pocket of high channel doping density in the vicinity of the drain, the magnitude of potential barrier is relatively easily modulated by the voltage Vds applied to the drain electrode. Increasing the magnitude of Vds (Normally, Vds>0 for nMOS and Vds<0 for pMOS) lowers the barrier and vice versa. Consequently, the MOSFET output characteristic, which is the drain current Ids vs Vds at a constant gate bias of Vgs, fails to saturate as well as it otherwise should. Thus, generally, pocket implanted MOSFETs exhibit a relatively high slope (high gds) in the saturation region compared to conventional MOSFETs with a laterally uniform channel, as shown in FIG. 3. Furthermore, since the pocket and the accompanying potential barrier is present at long and short lengths, the rapid improvement (i.e., reduction) in gds with increasing channel length, commonly seen for conventional MOSFETs, is typically absent for MOSFETs with pocket implants. Thus, with pocket implanted devices one does not even have the option of increasing the gate length to achieve the high gm/gds needed for acceptable analog performance.

There is a need in modern technologies to be able to build advanced circuitry of both a digital and analog nature on the same integrated circuit. Therefore, there is a need for a method of producing transistors that are more analog friendly along with digital transistors in the same monolithic solution.

SUMMARY OF THE INVENTION

An embodiment of the invention solves the problem of forming analog and digital transistors at the same time by providing a flatter surface concentration on the drain end of the channel doping profile for the analog transistors. Thus, the analog transistors exhibit a linear saturation characteristic with linearly increasing drain voltage. The low voltage digital transistors retain the pocket implants for fast charging and minimal drain resistance.

Another embodiment of the invention develops an optimized process flow for combining analog and digital transistors.

This and other advantages will be apparent to those of ordinary skill in the art having reference to the specification in conjunction with the drawings.

BRIEF DESCRIPTION OF THE DRAWINGS

In the drawings:

FIGS. 6A–6J are cross-sectional diagrams of digital and analog transistors according to the invention at various stages of fabrication;

FIG. 7 is a cross-sectional diagram of an alternative embodiment of the invention; and FIG. 8 is a cross-sectional diagram of an alternative embodiment of the invention.

DETAILED DESCRIPTION OF THE EMBODIMENTS

Figure 1:
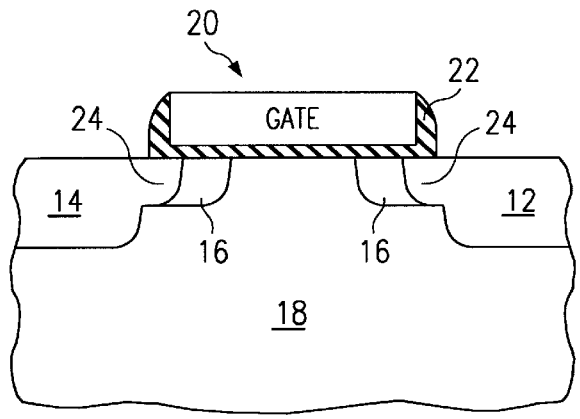
FIG. 1 is a cross-sectional diagram of a prior art MOS transistor with pocket implants.
Figure 2:
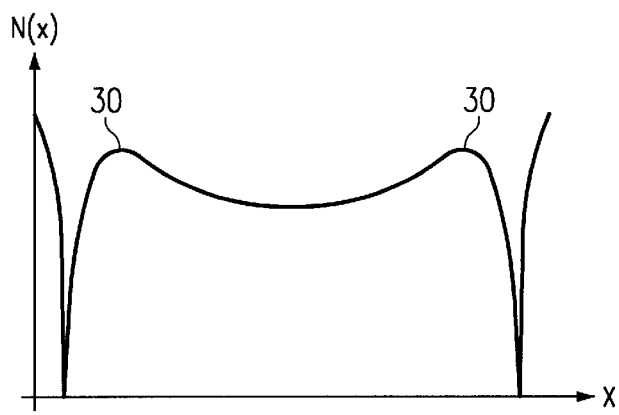
FIG. 2 is a graph of doping concentration across the channel of the MOS transistor with pockets of FIG. 1.

The invention is a method for forming analog and digital transistors at the same time and the devices formed thereby. The analog transistors of the invention have a flatter channel doping profile than the digital transistors. The invention will be described in conjunction with a digital CMOS process including the formation of pocket regions. It will be apparent to those of ordinary skill in the art that the benefits of the invention may be applied to other processes and devices.

A theoretical discussion of the problem of forming analog transistors in a digital CMOS process and the advantages of a flat channel doping profile for analog transistors is given first, followed by a discussion of the methods and devices of the invention.

Discussion of the Problem and Advantages of a Flat Channel Profile

The most important parameter in analog circuit design is voltage gain, Av. Av=Gm Rd, where Gm is the effective transconductance of the circuit topology and Rd is the total resistance at the output node of the circuit. For MOS, Gm is proportional to the square root(Id) while Rd is proportional to 1/Id. Since MOSFETs operate at low current (for most applications) the voltage gain is dominated by Rd not Gm.

The Early voltage, Va, is a parameter that characterizes the output resistance, Rd, or the output conductance, gds, of a MOSFET. A large Va means a large Rd or small gds. In process technologies at and before minimum gate length, Lmin, ~3 um and gate oxide thickness, Tox, ~40 nm, Va was a function of channel length only. For all process scaling since, Va is also a function of bias point. In fact, Va is a complex function of process, geometry and electrical operating point. For circuit designers it is important to know what Va is under all conditions. This is partly a modeling problem, but that is the case only when the process technology produces a MOSFET with Va large enough under all conditions to meet circuit needs.

In analog circuits the error terms are proportional to 1/Av. Therefore if Total Harmonic Distortion (THD) is 100 dB, then in general the voltage gain must be greater than 100 dB (100,000). If Analog-to-Digital conversion is being performed, say 16 bit, then Av>2^16=65,536. This gain must be achieved in 2 stages for linear circuits to be stable, therefore each gain stage must have Av>320. At the standard bias points of Id~10–20 uA, Gm~100–200 umho, Va must be >30 and probably >50 to work. In digital circuit design the voltage gain must be large enough to cause the output to change states (switch from one rail to the other) with an input of ~Vt. This only requires a gain of 4–12. Also digital circuits operate at much high currents and therefore higher Gm, so digital circuits do not need very high Va. In fact Va of 1–2 is fine for digital circuits.

Historically to get a Va of 50 or greater, a slightly longer than minimum channel length was all that was needed. In cases where Va>100 was needed it could be achieved by increased channel length. In pocket implant processes, Va's of greater than 10 are not possible no matter what the channel length. Therefore in order to make transistors capable of analog performance, a different process must be found.

Figure 3:
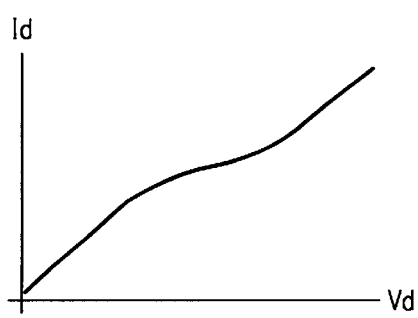
FIG. 3 is a graph of I–V characteristics for the MOS transistor with pockets of FIG. 1.
Figure 4:
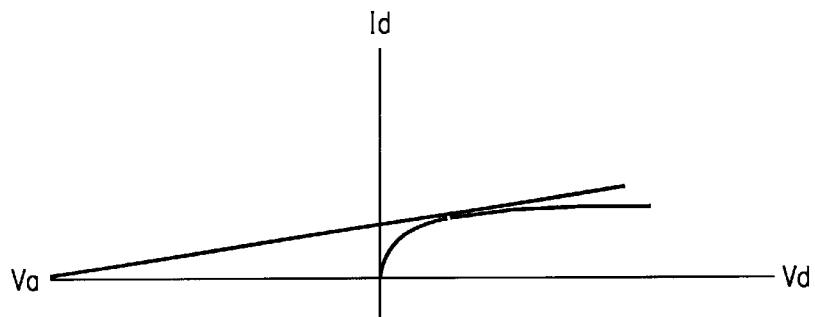
FIG. 4 is a graph of I–V characteristics for an analog transistor without pockets according to the invention.

In terms of electrical characterization of the device, digital performance is not worried about flatness of the I-V characteristic. In fact, a strong positive slope, such as that shown in FIG. 3, allows quick charging. However for analog functions this slope needs to be very flat as shown in FIG. 4. Horizontal is ideal. Generally, the slope increases with increasing drain voltage. The positive increase in slope is because once pinch-off of the channel has occurred the channel and hence the remaining resistance of the enhanced region decreases as the drain voltage Vds is increased. Furthermore, this increase is uniform with constant increasing Vds. That is to say that the slope of the saturation region has a constant slope that is positive. If a line is drawn tangential to this saturated characteristic and extrapolated back to the Vds axis, the voltage value at which the axis is crossed is the "early voltage" (Va). Obviously, when the saturated characteristic is flat then the Va is very high. In fact a perfectly flat curve would relate to zero slope and Va=infinity. Generally, a slope resulting in a Va of 50 to 100 is usual and a good value for building analog circuitry. However, the Va associated with the curve of FIG. 3 is significantly less than the 50 to 100 needed for analog functions.

Figure 5A:
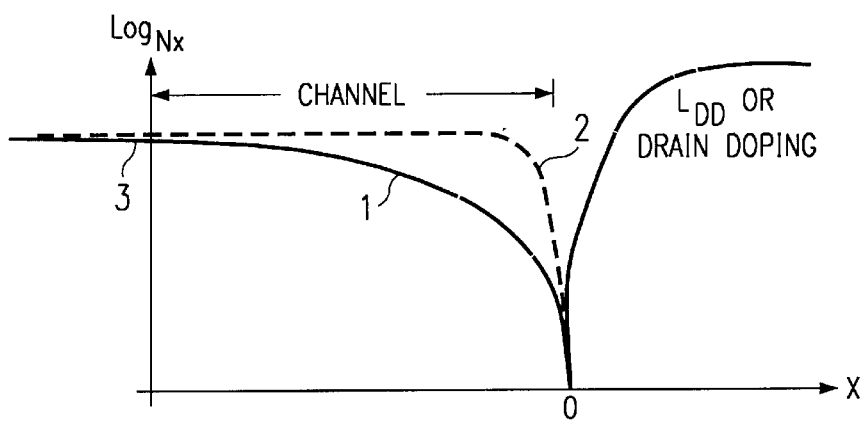
FIG. 5A is a graph of different doping profiles across a transistor channel.
Figure 5B:
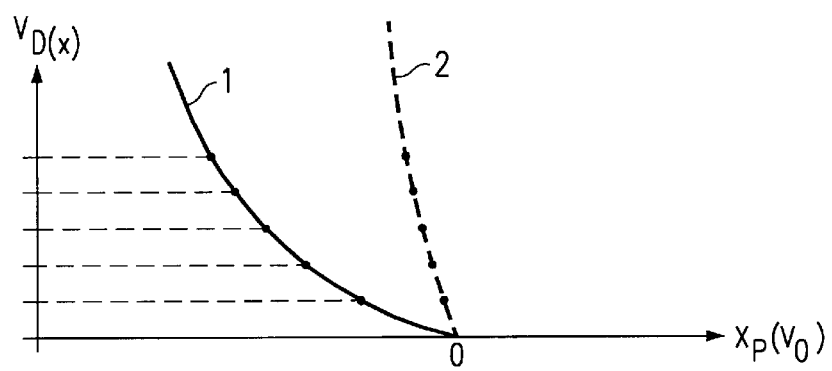
FIG. 5B is a graph of drain voltage vs. pinch-off point for two doping profiles of FIG. 5A.

FIGS. 5A–5E illustrate the relationship between doping profile and flat Id vs Vd, and thus early voltage Va. FIG. 5A is a graph of doping concentration at the drain end of a channel. The characteristics of a decreasing and increasing concentration, profiles 3 and 1 respectively, are associated with a graded channel (e.g., pocket implants and lateral diffusants). A steep flat profile 2 is associated with no pocket implants. FIG. 5B is a graph of the same two doping profiles 1, 2 translated to show how the pinch-off point $X_p$ changes for constant increasing drain voltages. In profile 1, the pinch-off point continues to change significantly with increasing drain voltage. However, in profile 2 the pinch-off point flattens out.

Figure 5C:
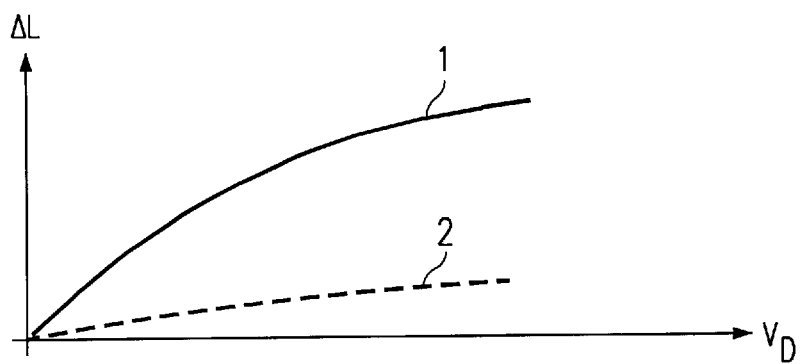
FIG. 5C is a graph of $\Delta L$ vs. drain voltage for two doping profiles of FIG. 5A.
Figure 5D:
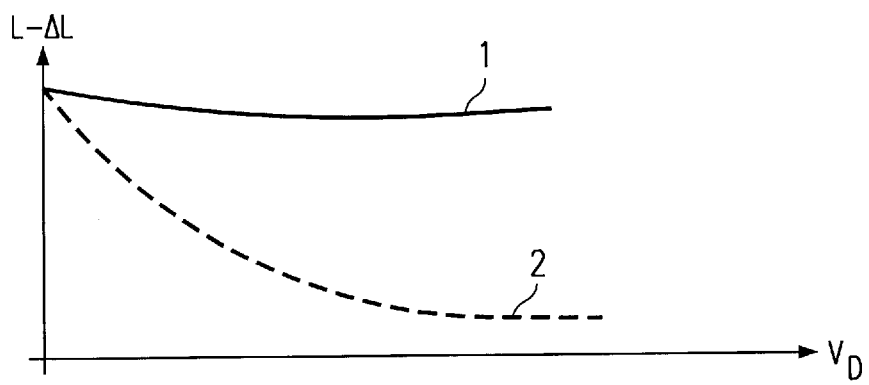
FIG. 5D is a graph of L-$\Delta L$ vs. drain voltage for two doping profiles of FIG. 5A.
Figure 5E:
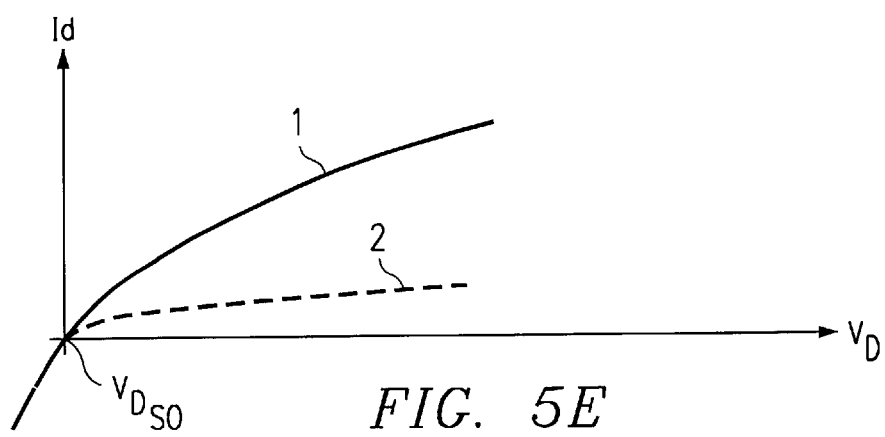
FIG. 5E is a graph of Id vs. drain current for two doping profiles of FIG. 5A.

The amount by which the channel is pinched off is called the delta channel length or delta L, here in denoted $\Delta L$. The amount by which $\Delta L$ increases for constant increments of applied Vds is determined by the channel profile. If the channel profile is constant or "FLAT" then this function will be uniform since Vt will be uniform. Therefore the slope will be a constant. If L overall is short compared to the increasing ΔL then the slope will be high since the reduction in remaining resistance will be large. That is the resistance will be smaller at a faster rate. FIG. 5C shows dopant profiles 1 and 2 translated to show ΔL versus drain voltage and FIG. 5D shows L-ΔL plotted vs drain voltage. In both figures, profile 2 has a relatively flat portion in the saturation region, while profile 1 does not. FIG. 5E shows Id vs Vd plotted from the relationship of Vd/(L−ΔL) for profiles 1 and 2. 1/L−ΔL is directly proportional to the resistance of the remaining channel. Again, profile 2 has a relatively flat portion while profile 1 does not. As discussed above, a flat Id versus Vd results in a larger Va, which is preferable for analog performance. Therefore, it is shown that in order to get a flat Id vs Vd in saturation, the doping profile on the drain end of the channel needs to quickly transition to being very flat.

When thinking about the transistor and what is happening during operation the following visual explanation is reasoned. When the drain side of the transistor is raised to a voltage level that the potential under the drain edge of the gate exceeds the applied gate voltage (Vg minus the threshold voltage) then the channel in that region can no longer be inverted; in fact the channel is turned off in that region and is said to be pinched off. For higher Vg, pinchoff will occur at higher Vds since it has to exceed the difference in Vg−Vt=Vgst. This is why the locus of points indicating the start of saturation and pinch-off is an increasing function also shown on the IV characteristics. Note that on the characteristics this value is higher than Vgst. This is because part of the drain voltage is dropped across the LDD or drain resistance region between the gate end and the contact location of the drain terminal. Now as the drain voltage is increased further the more of the drain end of the channel will become pinched off and hence the remaining resistance will be decreased and hence the current will increase proportionally since the potential across the remaining resistance will be constant. Therefore a positive slope is maintained in the saturation profile. The amount by which the channel is pinched off is called the delta channel length or delta L, here in denoted ΔL. The amount by which ΔL increases for constant increments of applied Vds is determined by the channel profile. If the channel profile is constant or "FLAT" then this function will be uniform since Vt will be uniform. Therefore the slope will be a constant. If L overall is short compared to the increasing ΔL then the slope will be high since the reduction in remaining resistance will be large. That is the resistance will be smaller at a faster rate. A high slope will mean a lower Va and more complicated circuit design. One method of remedy is to increase the channel length such that the ΔL value will be small relative to the channel length. This will maintain a very flat profile with increasing drain voltage.

Interestingly, in the case of pocket implants increasing the channel length does not much improve the Va since the effect is caused by self aligned drain pocket. The pocket is moved with the drain when the channel length is increased; hence, the output characteristic shape appears the same with added series resistance from the central flat portion of the channel.

To summarize, the important point here is that the flat profile will allow a very constant slope in saturation and also allow for the slope to be flatter by increasing the channel length. These effects allow for a large Va and good analog design. The critical aspect of this explanation is the concentration flatness of the channel profile.

In the case that the channel profile on the drain is not flat then the current characteristic with respect to constant changing drain voltage is not linear. That is the slope is no longer constant. This is because now the threshold voltage differs across the channel proportional to the net doping profile along the surface. If the doping is increasing then the Vt will increase and for constant increments in the Vds the amount of current increase will be less and hence a current role off will occur. This is always the case for a MOS transistor which is why there is a sharp role off but continuous characteristic when transitioning between linear and saturation. This occurs because of the formation of the junction between the back gate or body and the drain. The sharper this transition the sharper the role off into saturation. Once pinch off has passed this transition of graded doping and is into the flat constant doping portion of the channel then a constant slope is maintained.

Embodiments of the Invention

The invention solves the problem of forming analog and digital transistors at the same time by providing a flat surface concentration on the drain end of the channel doping profile for the analog transistors. Thus, the analog transistors exhibit a linear saturation characteristic with linearly increasing drain voltage.

In Table 1 a process flow for creating deep-submicron transistors is disclosed. A matrix is shown by which adding or subtracting various steps will create various combinations of high performance MOS transistors for integrated digital and analog circuit design. This flow is characterized by dual gate oxide and 3 styles of complementary MOS devices.

Methods for creating combinations of digital and analog transistors
1833C05 Deep sub-um Process masks for analog and digital CMOS

| | masks | A 1.8 V LV digital | B 3.3 V HV IO | C 1.8 V Sym Analog | D 1.8 V Asym D & A | E 1.8 V & 3.3 V Asym D & A | 1.8 DP | 1.8 AP | 1.8 DN | 1.8 AN | 3.3 IOP | 3.3 ION | |
|---|---|---|---|---|---|---|---|---|---|---|---|---|---|
| 1 | MOAT | x | x | x | x | x | x | x | x | x | x | x | Shallow etch for STI region |
| 2 | REV MOAT | x | x | x | x | x | | | | | | | Form CMP regions |
| 3 | VTN | x | x | x | x | x | x | x | | | x | | 4 implants to form nwell |
| 4 | VTP | x | x | x | x | x | | | x | x | | x | 4 implants to form pwell |

-continued

Methods for creating combinations of digital and analog transistors
1833C05 Deep sub-um Process masks for analog and digital CMOS

| | | Transisitor Style | | | | | | | | | | |
|---|---|---|---|---|---|---|---|---|---|---|---|---|
| | | A | B | C | D | E | 1.8 | 1.8 | 1.8 | 1.8 | 3.3 | 3.3 |
| | | | | | | 1.8 V & | | | | | | |
| | | 1.8 V | | 1.8 V | 1.8 V | 3.3 V | | | | | | |
| | | LV | 3.3 V | Sym | Asym | Asym | | | | | | |
| | masks | digital | HV IO | Analog | D & A | D & A | DP | AP | DN | AN | IOP | ION | |
| 5 | HVGX | | x | | | x | | | | | x | x | 80A thick gate oxide |
| 6 | N+ POLY | x | x | x | x | x | | | x | x | | x | Ntype poly implant for NMOS |
| 7 | Gate | x | x | x | x | x | x | x | x | x | x | x | Poly etch mask |
| 8 | NLDD/p-pocket | x | | | x | x | | | x | | | | LV n-LDD and p-type pocket |
| 9 | NLDD2(HV) | | x | x | x | x | | | | o | | x | higher voltage LDD use in LV analog |
| 10 | PLDD/n-pocket | x | | | x | x | x | | | | | | LV p-LDD and n-type pocket |
| | PLDD2 | | | | | | x | x | x | x | x | x | Blanket implant (counte doped in n-type) |
| 11 | NSD | x | x | x | x | x | | | x | x | | x | N+ connection |
| 12 | PSD | x | x | x | x | x | x | x | | | x | | P+ connection |
| 13 | CONT | x | x | x | x | x | x | x | x | x | x | x | |
| 14 | MET1 | x | x | x | x | x | x | x | x | x | x | x | |
| 15 | VIA1 | x | x | x | x | x | x | x | x | x | x | x | |
| 16 | MET2 | x | x | x | x | x | x | x | x | x | x | x | |
| 17 | VIA2 | x | x | x | x | x | x | x | x | x | x | x | |
| 18 | MET3 | x | x | x | x | x | x | x | x | x | x | x | |
| 19 | VIA3 | x | x | x | x | x | x | x | x | x | x | x | |
| 20 | MET4 | x | x | x | x | x | x | x | x | x | x | x | |
| 21 | PO | x | x | x | x | x | x | x | x | x | x | x | |
| | Total Mask | 19 | 19 | 18 | 20 | 21 | | | | | | | |

Table 1: Shows mask name and number vs process flow method and what transistor styles are obtained. A "D" is for digital and "A" is for analog where "IO" is for input/output when referring to transistor styles. For example a 1.8 and 3.3 stands for to signal level transistors of low voltage 1.8V and high voltage 3.3V.

The fabrication sequence of the invention will be described in conjunction with FIGS. 6A–6J. FIGS. 6A–6J illustrate the formation of various kinds of N-type transistors: low voltage (typically core) digital, high voltage (typically I/O) digital, analog symmetrical; and analog asymmetrical. As used herein, low and high voltage are relative to each other and refer to signal level or operating voltage. For example, the low voltage transistors may have an operating voltage of 1.8 V and the high voltage transistors may have an operating voltage of 3.3V. Like p-type transistors are also contemplated and discussed, but not shown for clarity.

Figure 6A:
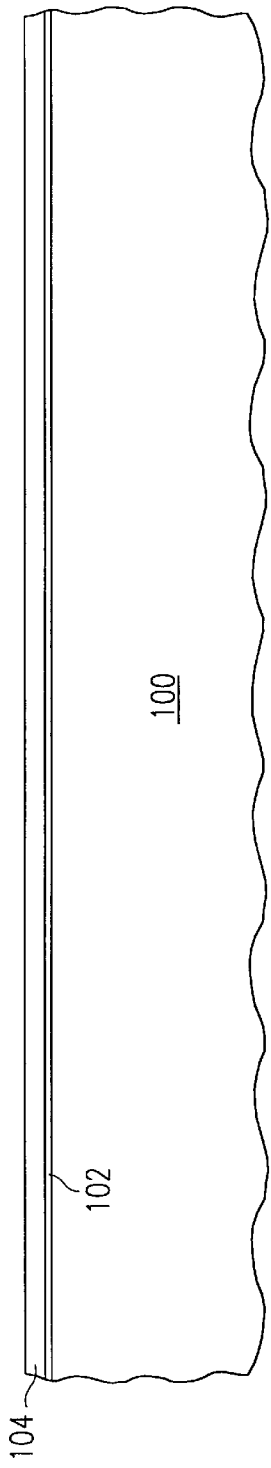

Referring to FIG. 6A, the isolation pad oxide 102 is deposited over a substrate 100. Substrate 100 is shown as a p-type substrate. Isolation pad nitride 104 is then formed over isolation pad oxide 102. Pad oxide 102 and pad nitride 104 are used to form a hard mask. Other suitable materials for forming hard masks are known in the art.

Figure 6B:
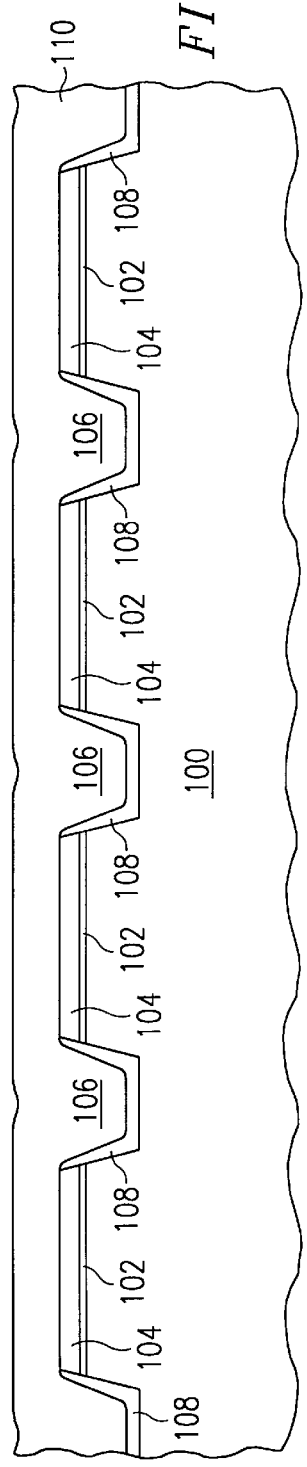

The first mask is MOAT. The MOAT mask patterns regions of substrate 100 for the shallow trench etch to form shallow trench isolation (STI) 106. After the shallow trench etch, the STI liner oxide 108 is formed in the trench followed by a STI fill 110, as shown in FIG. 6B. The STI fill is typically an APCVD (Atmospheric Pressure Chemical Vapor Deposition) oxide followed by a densification. It will be apparent to those of ordinary skill in the art that other isolation structures may alternatively be used.

Figure 6C:
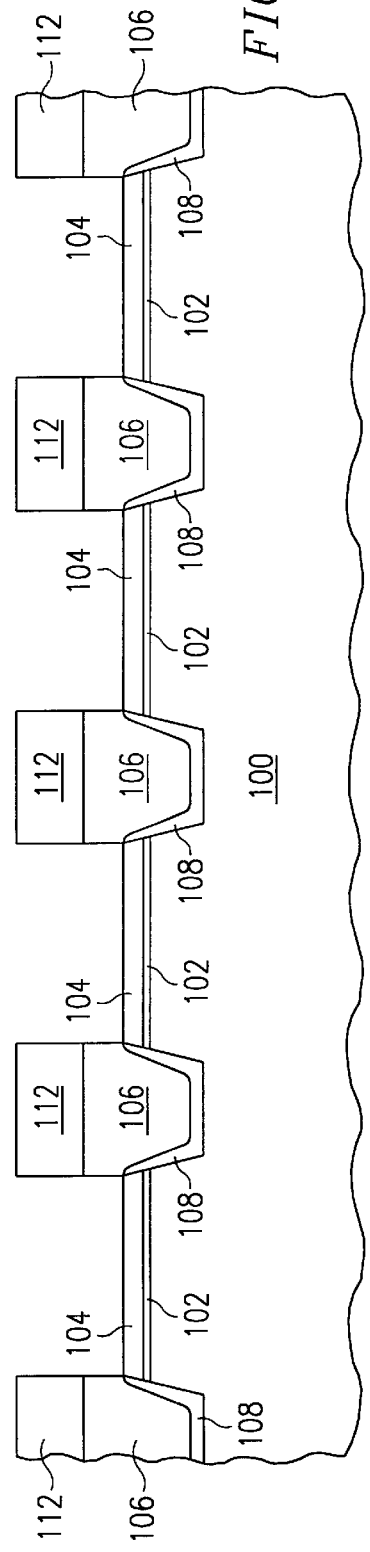

As shown in FIG. 6C, a reserve MOAT mask, REV MOAT, is then used to form a pattern 112 to etch the STI fill 110 from between STI regions 106. This is followed by a resist strip and STI CMP (chemical-mechanical polish) to remove the excess STI fill material 110. Then, a wet etch may be used to remove the pad nitride 104, as shown in FIG. 6D.

Next, the threshold voltage adjust masks, VTN mask and VTP mask, are used. The pattern 114 formed using the VTN mask is shown in FIG. 6E. Various threshold adjust implants are known in the art. In the preferred embodiment, VTN and VTP are quad implanted retrograde, multi layer PMOS 116 and NMOS wells respectively. The first implant is a surface VT adjust, the second implant is a subsurface punch-through implant, the third implant is a channel stop implant that lies along the bottom boundary of the STI 106 regions, and lastly a mega volt "MEV" well implant is formed. These implants are all p-type for the NMOS devices "VTN", and all n-type for the PMOS devices "VTP".

The MOAT, REV MOAT, VTN, and VTP masks are used regardless of the type of MOS transistors desired. In other words, these masks are used for low voltage digital, high voltage (e.g., I/O) digital, analog symmetric, analog asymmetric, or any combination thereof.

After the VTN and VTP implants, a high voltage gate oxide 120 is grown if higher voltage (I/O) transistors are desired. The high voltage gate oxide 120 is typically on the order of 80 Å. Referring to FIG. 6F, the HVGX mask is used to form a pattern 118 where the thick gate oxide 120 will remain for higher voltage (e.g., 3.3V) I/O transistors and for memory modules. The HVGX mask is used only when higher voltage transistors are desired. If higher voltage transistors are not desired, this masking level and the high voltage gate oxide 120 are eliminated and the thinner, low voltage gate oxide 122 is formed instead. After this region is patterned (if higher voltage transistors are desired), the thick oxide 120 is stripped from the exposed regions and a thin (e.g., 40 Å) gate oxide 122 is grown across the rest of the surface.

Next, the polysilicon gate layer 126 is deposited. An NPOLY mask is used to form a pattern for doping the N type polysilicon for NMOS devices. After the N+ polysilicon doping, the GATE mask is used to create a pattern for the polysilicon gate etch. The structure after gate etch is shown in FIG. 6G. The GATE mask is used for all MOS transistor types.

Figure 6H:
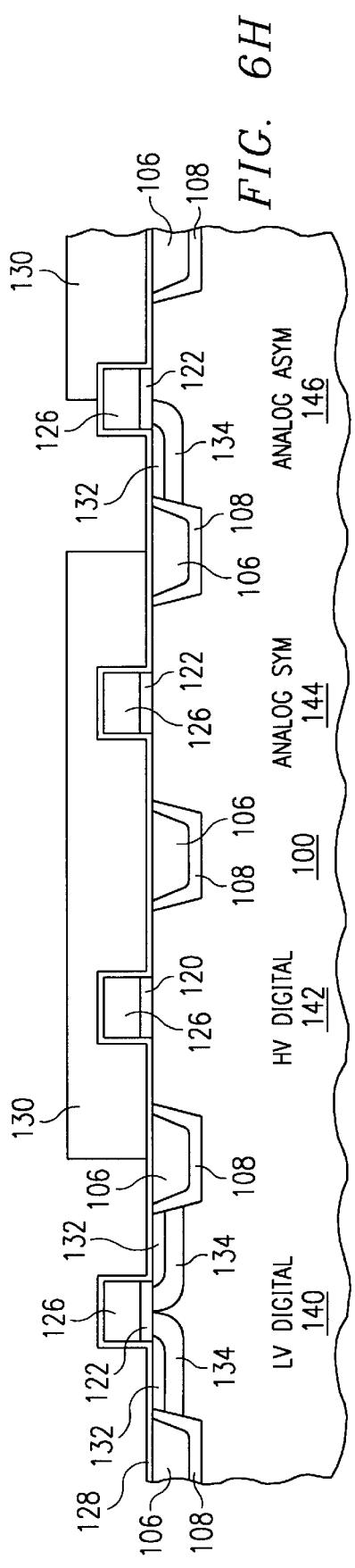

A cap oxide 128 is formed over the structure and the low voltage n-type lightly doped drain (LDD) 132 and p-type low voltage (e.g., 1.8V) digital NMOS pocket 134 regions are co-implanted through a single NLDD pattern 130, as shown in FIG. 6H. Arsenic may be used for the LDD region 132 and boron may be used for pockets 134. The NLDD pattern 130 is used to mask the regions of substrate 100 where the high voltage transistors (142) and analog symmetric transistors (144) are to be formed as well as the drain side of the regions for the analog asymmetric transistors (146). Thus, the pocket regions 134 are prevented from being formed in the analog symmetric transistors 144 and the drain side of the analog asymmetric transistors 146, as well as the I/O transistors 142.

The pocket is an angle implant. The pockets 134 add to the surface channel profile creating peaks by which the threshold voltage is set at the maximum point of concentration. This yields very low Va and nonlinear saturated characteristics that are bad for analog performance. However, it also yields fast charging and minimal drain resistance, which offer superb digital performance. Accordingly, pockets 134 are formed where they offer an advantage (high performance digital), but not where they impair performance (drain side of analog transistors).

Figure 6I:
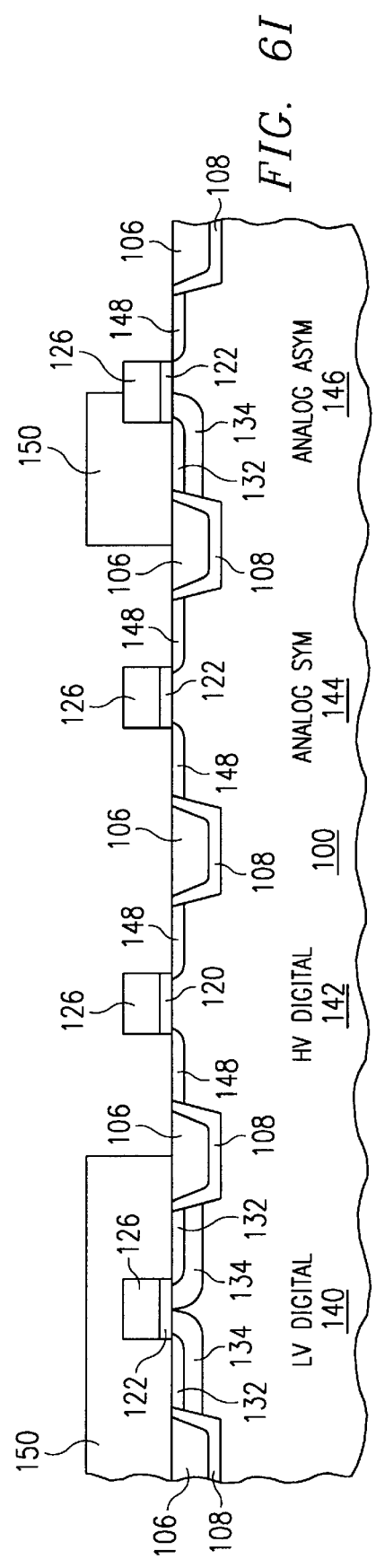

As shown in FIG. 6I, a second NLDD2 mask and pattern 150 may be used for implanting into the high voltage transistors 142, the analog symmetric transistors 144, and the source side of the analog asymmetric transistors 146. The NLDD2 mask is for the n-type high voltage (e.g., 3.3V I/O style) transistor lightly doped drain 148. This implant can be used in the pure digital CMOS flow in place of the NLDD combination pocket implant to flatten the profile creating a nice analog low voltage transistor. The Vt will be less than the digital low voltage transistor since the peaks from the pocket will be absent. The lighter doped drains will allow depletion pull back in combination with channel profile flattening and hence much enhanced Va. The lighter doped drain will effect the sharpness of linear to saturation transition and have a subtle enhanced Va effect for a shorter channel, by allowing more volts to be dropped in the drain region. Drain series resistance will be increased because of the lighter doping. Hence the linear region will have more slope and saturation will occur at slightly higher Vds.

The NLDD mask is used only when low voltage digital transistors 140 or analog asymmetric transistors 146 are desired. The NLDD2 mask is used only when high voltage transistors 142, analog symmetrical transistors 144 or analog asymmetric transistors 146 are desired.

Next, the PLDD mask is used. A low voltage p-type lightly doped drain, and n-type low voltage 1.8V digital NMOS pocket implant are co-implanted through same mask. The pocket is angle implant. The function is the same as mentioned above for NLDD. Then, a p-type high voltage 10 style transistor lightly doped drain implant is performed. This implant is a blanket and is counter doped in the n-type regions for NMOS devices. Used the same way as the NLDD2 for PMOS.

The remaining levels are standard style levels known to those familiar with the art and are used regardless of the type of MOS transistors desired. As shown in FIG. 6J, sidewall spacers 151 are formed and a n-type source/drain 152 is implanted using a NSD mask. The NSD pattern 154 is then removed. A similar mask, PSD, is used for the p-type source/drain implant. The NSD and PSD implants are identical for all n-type and p-type transistors respectively. Fabrication may then continue with a standard metal backend process.

The above process forms low voltage digital transistors, I/O transistors, analog symmetrical transistors, and analog asymmetrical transistors of both n and p type. However, not all types of transistors are needed on the various types of semiconductor devices. The value of Table 1 is that only those process steps needed to form the desired transistors may be selected and performed. For example, if only the low voltage digital transistors are desired, the HVGX and NLDD2 mask levels may be eliminated.

In a process containing both advanced digital CMOS with pockets and higher voltage IO or embedded STORAGE device CMOS for example FLASH with no pockets (such as a dual oxide 1.8V and 3.3V process for example), good performing advanced low voltage analog transistors can be built in the following manor.

1) Use the pocket implant LDD of the low voltage digital transistor on the source side and the lighter dose LDD2 of the high voltage CMOS on the drain side. This will produce a very nice analog transistor (asymmetric) with the channel flat on the drain side of the device. This is necessary because the source drain extension of the digital pocket implant is co-implanted with the pocket of opposite type and would require a mask to separate them. This will have a VT similar to the digital CMOS set by the peak concentration of the pocket on the source side.

2) Use the LDD2 on both source and drain side of the digital CMOS base (symmetric analog). This will create a low VT transistor with very good analog characteristics and a flat channel. This device will model nicely also.

3) In the case of 1 above this transistor yields excellent channel length vs Va and Idrive and Ioff performance with slightly higher Vt but requires both digital and high voltage transistors present. Here all types of transistors can be built simultaneously. Digital and High voltage and both types of low voltage analog CMOS for mentioned CMOS.

4) In the case of 2 above these transistors could be built in with no digital stand alone or along side the high voltage devices. The above accomplishes Digital and Analog CMOS in the same process at the same time with and without angled pocket implants in source and drain respectively, where by said "without pockets" refers to without both pockets and/ or without one or the other pocket on either the source or the drain side.

The source side only pocket (analog asymmetric) has several advantages. First, it achieves improved analog Va performance by allowing a flat channel profile on the drain side of the transistor. The flatness of drain side of transistor is set by VT implant in combination with well profiles. Second, the source side only pocket allows higher gain due to role off of concentration on drain side and hence reduced R-on in that portion of flat profile channel region while allowing threshold to be set by peak region on source side. Third, the source side only pocket allows improved PT BV over no pockets by supplying a higher doped region on the source side to stand off depletion spreading. Fourth, the source side only pocket has higher voltage and lower concentration LDD2 implant on drain side and allows improved CHC performance by reducing field on drain side of device. Fourth, the source side only pocket allows improved safe operation in the case of low voltage switching power application by decreasing parasitic base resistance of parasitic inherent bipolar device and there by providing higher latch up prevention of said parasitic device.

In addition, the source side only pocket allows lower gate to drain capacitance and hence should allow increased switching speed performance for equal gate length and width over source/drain pocket scheme. The source side only pocket for high performance analog CMOS is achievable and compatible with building state of art deep submicron digital CMOS in the same process at the same time on the same silicon substrate using the same wafer fabrication steps.

Another method for flattening the drain profile of the analog transistors is to use two sets of pocket implants, as shown in FIG. 7. One set pockets 200 for the analog transistors has a lower dose and simultaneously boosts the Vt dose to increase performance of the analog transistors. The other pockets 134 remain standard for the digital CMOS and does not interrupt digital CMOS performance. The lower dose pocket can also be limited to the source side only of the analog transistors. However, this method requires an additional masking step. One masking step is used to implant both the digital CMOS drain extensions and digital pockets 134. A second masking step is used to implant the analog drain extensions and analog pocket 200.

Yet another method for flattening the drain profile of the analog transistors is to increase the VT 202 for the analog transistors and keep the pockets in the analog transistors, as shown in FIG. 8. In this case, both the analog and digital transistors can be formed within the common digital implant patterns at the same time since the analog VT implant for channel flattening will be a separate mask pattern.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating an integrated circuit, comprising the steps of:
    fabricating a plurality of digital transistors using a first pocket implant; and
    fabricating a first plurality of analog transistors using a second pocket implant having a lower dose than said first pocket implant on at least a source side.

2. The method of claim 1, wherein the step of fabricating a plurality of digital transistors comprises the step of using a lightly doped implant to form a drain extension region in said plurality of digital transistors using a first mask and wherein the step of fabricating a first plurality of analog transistors comprises forming a drain extension region in said first plurality of analog transistors using a second mask, wherein said first mask is used for the first pocket implant and the second mask is used for the second pocket implant.

3. The method of claim 1, wherein said step of fabricating said first plurality of analog transistors uses said second pocket implant on a drain side of the first plurality of analog transistors and said first pocket implant on a source side of said first plurality of analog transistors.

4. The method of claim 1, further comprising the step of forming a second plurality of analog transistors using said second pocket implant on both a drain side and a source side of said second plurality of analog transistors.

5. A method of fabricating an integrated circuit, comprising the steps of:
    forming a plurality of isolation structures in a semiconductor body;
    forming a plurality of gate structures over said semiconductor body;
    implanting a first n-type lightly doped drain region and a first p-type pocket region in a first plurality of digital transistors regions using a first masking layer;
    implanting a second n-type lightly doped drain region and a second p-type pocket region in at least a drain side of said plurality of analog transistor regions using a second masking layer; and
    forming a source and drain region in each of said first plurality of digital transistor regions and said plurality of analog transistor regions.

6. The method of claim 5, wherein said at least a drain side of said plurality of analog transistor regions includes a source said of at least a subset of said plurality of analog transistor regions.

7. The method of claim 5, further comprising the step of implanting a high voltage n-type lightly doped drain region in a second plurality of digital transistors.

* * * * *